(12) United States Patent
Ma et al.

(10) Patent No.: US 12,506,119 B2
(45) Date of Patent: Dec. 23, 2025

(54) SYSTEM-ON-CHIP INTEGRATED PACKAGING STRUCTURE, HAVING A CHIP EMBEDDED IN A RECESS, MANUFACTURING METHOD THEREFOR AND THREE-DIMENSIONAL STACKED DEVICE

(71) Applicant: HUATIAN TECHNOLOGY (KUNSHAN) ELECTRONICS CO., LTD., Kunshan (CN)

(72) Inventors: Shuying Ma, Kunshan (CN); Jiao Wang, Kunshan (CN); Zhiyi Xiao, Kunshan (CN); Fengxia Zheng, Kunshan (CN)

(73) Assignee: HUATIAN TECHNOLOGY (KUNSHAN) ELECTRONICS CO., LTD., Kunshan (CN)

( * ) Notice: Subject to any disclaimer, the term of this patent is extended or adjusted under 35 U.S.C. 154(b) by 565 days.

(21) Appl. No.: 17/957,060

(22) Filed: Sep. 30, 2022

(65) Prior Publication Data

US 2023/0022427 A1 Jan. 26, 2023

Related U.S. Application Data

(63) Continuation of application No. PCT/CN2020/093970, filed on Jun. 2, 2020.

(30) Foreign Application Priority Data

Apr. 2, 2020 (CN) .......................... 202010255403.6

(51) Int. Cl.
*H01L 25/065* (2023.01)
*H01L 23/00* (2006.01)
(Continued)

(52) U.S. Cl.
CPC ...... *H01L 25/0657* (2013.01); *H01L 23/3121* (2013.01); *H01L 23/481* (2013.01);
(Continued)

(58) Field of Classification Search
CPC ... H01L 23/3121; H01L 23/481; H01L 24/14; H01L 24/19; H01L 24/24; H01L 24/32;
(Continued)

(56) References Cited

U.S. PATENT DOCUMENTS

| 5,306,670 A | 4/1994 | Mowatt et al. |
| 2010/0013081 A1 | 1/2010 | Toh et al. |

(Continued)

FOREIGN PATENT DOCUMENTS

| CN | 101232008 A | 7/2008 |
| CN | 103208428 A | 7/2013 |

(Continued)

OTHER PUBLICATIONS

First Office Action issued in counterpart Chinese Patent Application No. 202010255403.6, dated Sep. 16, 2021.
(Continued)

*Primary Examiner* — Khiem D Nguyen
(74) *Attorney, Agent, or Firm* — Westbridge IP LLC

(57) ABSTRACT

Disclosed are a system-on-chip integrated packaging structure, a manufacturing method therefor and a three-dimensional stacked device. The system-on-chip integrated packaging structure includes: a substrate, a chip, a first electrical connection structure and a second electrical connection structure. A front surface of the substrate is provided with a recess and a via welding pad, and a back surface of the substrate is provided with a conductive via extending to the via welding pad. The chip is embedded in the recess, and a chip welding pad is disposed on a surface of the chip away from a bottom surface of the recess. Different chips may be
(Continued)

electrically connected by means of the first electrical connection structure and the second electrical connection structure, which is conducive to form a three-dimensional stacked structure with high-density interconnection, miniaturized packaging and thinning.

12 Claims, 7 Drawing Sheets

(51) Int. Cl.
  *H01L 23/31* (2006.01)
  *H01L 23/48* (2006.01)
  *H01L 25/00* (2006.01)
(52) U.S. Cl.
  CPC .............. *H01L 24/14* (2013.01); *H01L 24/19* (2013.01); *H01L 24/24* (2013.01); *H01L 24/32* (2013.01); *H01L 25/50* (2013.01); *H01L 24/73* (2013.01); *H01L 2224/14181* (2013.01); *H01L 2224/19* (2013.01); *H01L 2224/24147* (2013.01); *H01L 2224/32145* (2013.01); *H01L 2224/73253* (2013.01)
(58) Field of Classification Search
  CPC ....... H01L 25/0657; H01L 2224/32145; H01L 2224/73253; H01L 2224/14181; H01L 23/49827; H01L 23/49816; H01L 23/5389; H01L 23/538; H01L 2225/06548
  See application file for complete search history.

(56) References Cited

U.S. PATENT DOCUMENTS

| | | | | |
|---|---|---|---|---|
| 2010/0133704 | A1* | 6/2010 | Marimuthu | H01L 23/3128 257/E23.116 |
| 2012/0020026 | A1* | 1/2012 | Oganesian | H01L 25/105 361/728 |
| 2015/0235915 | A1* | 8/2015 | Liang | H01L 25/0652 361/764 |
| 2015/0329351 | A1* | 11/2015 | Cheng | B81B 7/007 438/51 |
| 2018/0366403 | A1* | 12/2018 | Yu | H01L 23/147 |
| 2021/0098636 | A1* | 4/2021 | Tai | H01L 23/3731 |

FOREIGN PATENT DOCUMENTS

| | | |
|---|---|---|
| CN | 103579190 A | 2/2014 |
| CN | 105428326 A | 3/2016 |
| CN | 105575913 A | 5/2016 |
| CN | 106449547 A | 2/2017 |
| CN | 109148431 A | 1/2019 |

OTHER PUBLICATIONS

International Search Report issued in corresponding PCT Application No. PCT/CN2020/093970, dated Dec. 31, 2020.

Written Opinion issued in corresponding PCT Application No. PCT/CN2020/093970, dated Dec. 31, 2020.

* cited by examiner

SYSTEM-ON-CHIP INTEGRATED PACKAGING STRUCTURE, HAVING A CHIP EMBEDDED IN A RECESS, MANUFACTURING METHOD THEREFOR AND THREE-DIMENSIONAL STACKED DEVICE

CROSS-REFERENCE TO RELATED APPLICATIONS

This application is a continuation of International Application No. PCT/CN2020/093970, filed on Jun. 2, 2020, which claims priority to Chinese Patent Application No. 202010255403.6, filed on Apr. 2, 2020. The entire content of both applications is incorporated herein by reference in their entireties.

TECHNICAL FIELD

The embodiments of the present application relate to the field of semiconductor chips technologies, in particular to a system-on-chip integrated packaging structure, a manufacturing method therefor, and a three-dimensional stacked device.

BACKGROUND

With a diversified development in applications of markets, a demand for a miniaturized high-density three-dimensional integrated packaging technology is increasing. At present, for an existing silicon-based fan-out three-dimensional packaging structure, an opening of a vertical conductive via structure of which is on a surface where a chip is embedded, and an actual process is very difficult to realize, mainly due to a process defect of isolation of a vertical via of the structure. In addition, in a manufacturing process of the silicon-based fan-out three-dimensional packaging structure, it is necessary to expose a metal pad at a bottom of the vertical conductive via structure by grinding. The grinding involves a simultaneous grinding of metal, polymer and silicon materials, which requires a chemical mechanical polishing technology. Equipments are expensive and costs are high.

SUMMARY

Embodiments of the present application aim to provide a system-on-chip integrated packaging structure, a manufacturing method therefor and a three-dimensional stacked device to overcome the shortcomings described above.

According to an aspect of embodiments of the present application, a system-on-chip integrated packaging structure is provided, including: a substrate, a chip, a first electrical connection structure and a second electrical connection structure. A front surface of the substrate is provided with a recess and a via welding pad, and a back surface of the substrate is provided with a conductive via extending to the via welding pad. The chip is embedded in the recess, and a chip welding pad is disposed on a surface of the chip away from a bottom surface of the recess. The first electrical connection structure is formed on the front surface of the substrate, the second electrical connection structure is formed on the back surface of the substrate, the first electrical connection structure is electrically connected to the chip welding pad, and the first electrical connection structure is electrically connected to the second electrical connection structure through the via welding pad and the conductive via.

In some embodiments of the present application, the first electrical connection structure is electrically connected to the via welding pad and the chip welding pad through a first metal redistribution, and the second electrical connection structure is electrically connected to the via welding pad through a second metal redistribution extending into the conductive via.

In some embodiments of the present application, a material of the substrate is an insulating material.

In some embodiments of the present application, a material of the substrate is a non-insulating material, and a first insulating layer is disposed between the front surface of the substrate, a side wall of the recess and the chip.

In some embodiments of the present application, the first insulating layer is made of silicon oxide, silicon nitride, polyimide or epoxy resin.

In some embodiments of the present application, the system-on-chip integrated packaging structure further includes a second insulating layer formed on the first insulating layer and the first metal redistribution.

In some embodiments of the present application, a size of an opening at a top of the recess is greater than or equal to a size of a bottom of the recess, a depth of the recess is less than or equal to a thickness of the substrate, a shape of a cross-section of the recess is rectangular or trapezoidal, and the cross-section is on a plane perpendicular to and intersecting with the front surface and the back surface of the substrate.

In some embodiments of the present application, the first electrical connection structure is a first solder ball or a first metal bump formed on the front surface of the substrate, and the second electrical connection structure is a second solder ball or a second metal bump formed on the back surface of the substrate.

In some embodiments of the present application, a passivation layer is formed on the back surface of the substrate and a hole wall of the conductive via.

In some embodiments of the present application, the conductive via is completely or partially filled with metal. When the conductive via is partially filled with the metal, an unfilled space of the conductive via is filled with dry film or passivation adhesive.

According to another aspect of embodiments of the present application, a manufacturing method for a system-on-chip integrated packaging structure is provided, including: forming at least one recess on a front surface of a substrate; embedding a chip in each of the at least one recess; disposing a via welding pad on the front surface of the substrate, a chip welding pad being disposed on a surface of the chip away from a bottom surface of the recess; disposing a first electrical connection structure on the front surface of the substrate, the first electrical connection structure being electrically connected to the via welding pad and the chip welding pad; disposing a conductive via connected to the via welding pad on a back surface of the substrate; disposing a second electrical connection structure on the back surface of the substrate, the first electrical connection structure being electrically connected to the second electrical connection structure through the via welding pad and the conductive via.

In some embodiments of the present application, the disposing a first electrical connection structure on the front surface of the substrate includes: disposing a first metal redistribution on the via welding pad and a side of the chip welding pad away from the substrate; and disposing the first electrical connection structure on a side of the first metal redistribution away from the substrate.

In some embodiments of the present application, the disposing a conductive via connected to the via welding pad on the back surface of the substrate includes: coating an adhesive layer on the front surface of the substrate, and bonding a bearing sheet on the adhesive layer through a temporary bonding process; thinning the substrate from the back surface of the substrate; and disposing the conductive via on the back surface of the thinned substrate.

In some embodiments of the present application, the disposing a second electrical connection structure on the back surface of the substrate includes: disposing a second metal redistribution on a side wall of the conductive via, the second metal redistribution extending to the back of the substrate, and the second metal redistribution being electrically connected to the first electrical connection structure through the via welding pad; filling the conductive via provided with the second metal redistribution with polymer; and disposing the second electrical connection structure on a side of the second metal redistribution away from the substrate.

According to another aspect of embodiments of the present application, a three-dimensional stacked device is provided, including: at least two system-on-chip integrated packaging structures disposed in layers as described in an aspect of embodiments of the present application. In an adjacent system-on-chip integrated packaging structure, a second electrical connection structure of a system-on-chip integrated packaging structure is electrically connected to a first electrical connection structure of another system-on-chip integrated packaging structure.

The embodiments of the present application provide the system-on-chip integrated packaging structure, the manufacturing method therefor, and a three-dimensional stacked device. By disposing the first electrical connection structure on the front surface of the substrate, disposing the conductive via electrically connected to the first electrical connection structure on the back surface of the substrate, and then disposing the second electrical connection structure on the back surface of the substrate, a manufacturing process may be simplified and manufacturing costs may be reduced, so that different chips may be electrically connected by means of the first electrical connection structure and the second electrical connection structure, which is conducive to form a three-dimensional stacked structure with high-density interconnection, miniaturized packaging and thinning.

BRIEF DESCRIPTION OF THE DRAWINGS

In order to describe the technical solutions in the embodiments of the present application or the prior art more clearly, the accompanying drawings required for describing the embodiments or the prior art are briefly described below. Apparently, the accompanying drawings in the following description show merely some implementations of the present application, and a person of ordinary skill in the art may still derive other accompanying drawings from these accompanying drawings without creative efforts.

DETAILED DESCRIPTION OF THE EMBODIMENTS

The technical schemes in the embodiments of the present disclosure will be described clearly and completely below in combination with the accompanying drawings in the embodiments of the present disclosure. Obviously, the described embodiments are only a part of the embodiments of the present disclosure, not all of the embodiments. Based on the embodiments in the present disclosure, all other embodiments obtained by those skilled in the art without creative efforts shall fall within the protection scope of the present disclosure.

Usually, in a manufacturing process of a silicon-based fan-out packaging structure, an opening of a conductive via is disposed on a surface where a chip is embedded, which makes the manufacturing process difficult, especially an insulating process of the conductive via. Specifically, after the chip is embedded, a gap between the chip and a silicon substrate is filled with polymer, and there may be an insulation layer of polymer on a surface of the silicon substrate. After a conductive via etching is completed, an insulation of a side wall of the conductive via may only be realized by using silicon dioxide or polymer. The silicon dioxide may not be deposited on the polymer, and the polymer spraying method may not ensure that the side wall is glued. There are no suitable materials in the industry to cover the side wall of the conductive via evenly, especially for a high aspect-ratio via structure. At present, silicon dioxide insulation is widely used in three-dimensional stacked structures, which requires deposition on a silicon surface.

Embodiments of the present application provide a system-on-chip integrated packaging structure. An opening of a conductive via in the system-on-chip integrated packaging structure is disposed on a back surface where the chip is embedded, that is, the conductive via is disposed on a back surface of a substrate, which may simplify a manufacturing process and reduce manufacturing costs.

Figure 1:
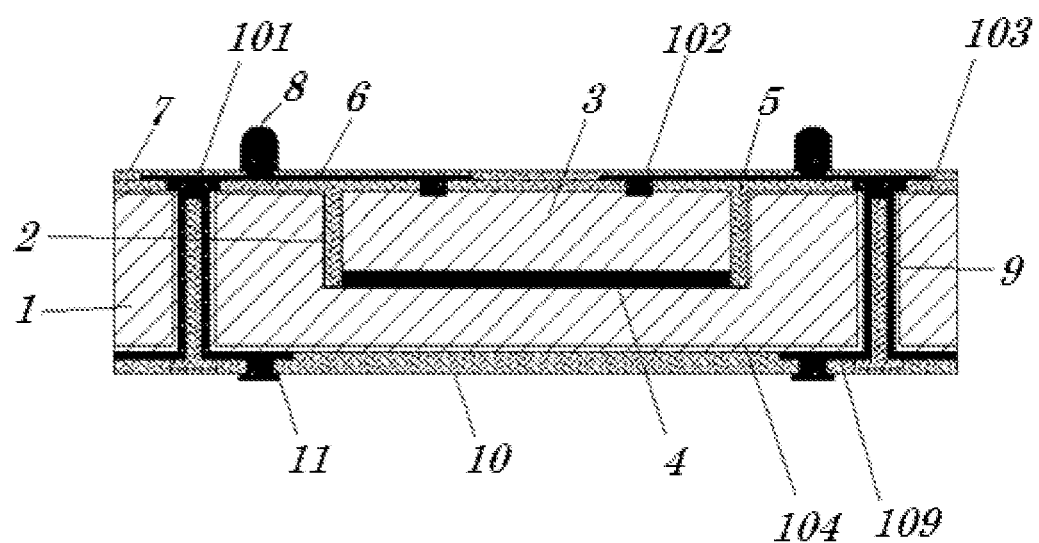
FIG. 1 is a schematic structural diagram of a system-on-chip integrated packaging structure according to an embodiment of the present application.

FIG. 1 is a schematic structural diagram of a system-on-chip integrated packaging structure according to an embodiment of the present application. As shown in FIG. 1, the system-on-chip integrated packaging structure includes: a substrate 1, a chip 3, a first electrical connection structure 8 and a second electrical connection structure 11.

A front surface of the substrate 1 is provided with a recess 2 and a via welding pad, and a back surface of the substrate 1 is provided with a conductive via 9 extending to the via welding pad. The chip 3 is embedded in the recess 2, and a chip welding pad is disposed on a surface of the chip 3 away from a bottom surface of the recess 2. The first electrical connection structure 8 is formed on the front surface of the substrate 1, the second electrical connection structure 11 is formed on the back surface of the substrate 1, the first electrical connection structure 8 is electrically connected to the chip welding pad, and the first electrical connection structure 8 is electrically connected to the second electrical connection structure 11 through the via welding pad and the conductive via 9.

The substrate 1 includes a front surface 103 and a back surface 104. A material of the substrate 1 may be an insulating material or a non-insulating material. The insulating material may be inorganic non-metallic materials, such as silicon dioxide or silicon nitride, or organic polymer materials, such as polyimide, epoxy resin, etc. When the material of the substrate 1 is the non-insulating material, a silicon oxide layer is also deposited on the front surface 103 of the substrate 1 and a side wall and a bottom surface of the recess 2. When the material of the substrate 1 is the insulating material, it is not necessary to deposit the silicon oxide layer.

In order to realize the system-on-chip integrated packaging of the chip 3, the front surface 103 of the substrate 1 is provided with the recess 2 and the via welding pad, and the chip 3 is embedded in the recess 2 of the front surface 103 of the substrate 1. In an embodiment, a side of the chip 3 is bonded to the bottom surface of the recess 2, another side of the chip 3 is provided with the chip welding pad, and a first insulating layer 5 is disposed between the chip 3 and the recess 2 and on the front surface 103 of the substrate 1, so the chip 3 is coated in the recess 2. A surface of the chip 3 mentioned above with the chip welding pad close to the front surface 103 of the substrate 1, which is conducive to a manufacturing of the first insulating layer 5 and form a flat insulating surface.

In the embodiment, the substrate 1 may be a silicon substrate. An insulating layer is directly laid on a surface of the silicon substrate, preferably using silicon dioxide for insulation. A process is mature and stable. For grinding and thinning of the back surface of the substrate, only the silicon substrate is needed to thin, which simplifies a process and reduces costs and has practical mass production application value.

According to an embodiment of the present application, the recess 2 may be formed by dry etching, wet etching, laser and other technologies. A shape of a cross-section of the recess 2 is rectangular or trapezoidal, and the cross-section is on a plane perpendicular to and intersecting with the front surface 103 and the back surface 104 of the substrate 1. A top view of the recess 2 may be rectangular, square or other shapes suitable for an arrangement of various chips 3 and the embedding of various chips 3. A size of an opening at a top of the recess 2 is greater than or equal to a size of a bottom of the recess 2, a depth of the recess 2 is less than or equal to a thickness of the substrate 1, and a size of the recess 2 may meet a requirement of placing the chip 3 in the recess 2.

The back surface 104 is provided with at least one conductive via 9 extending to the via welding pad of the front surface 103. The conductive via 9 may be a straight hole or an inclined hole, and the conductive via 9 may be formed by dry etching, laser and other technologies for signal interconnection. This embodiment preferably adopts the straight hole structure.

In addition, the conductive via 9 is completely or partially filled with metal. When the conductive via is partially filled, an unfilled space of the conductive via 9 is filled with dry film or passivation adhesive. In an embodiment, considering costs, the conductive via 9 is not completely filled with metal, and a reserved gap of the conductive via 9 may be filled with dry film or passivation adhesive to form a hole plugging structure. The reserved gap may adopt a full-hole plugging structure, a half-hole plugging structure or a non plugging structure. In this embodiment, the full-hole plugging structure is preferred.

According to an embodiment of the present application, the first electrical connection structure 8 is electrically connected to the via welding pad and the chip welding pad through a first metal redistribution 6, and the second electrical connection structure 11 is electrically connected to the via welding pad through a second metal redistribution 109 extending into the conductive via 9. In this way, different chips 3 may be welded through the first electrical connection structure 8 and the second electrical connection structure 11, which is conducive to form a high-density interconnection, package miniaturization and thin-and-light three-dimensional stacked structure.

In an embodiment, the first electrical connection structure 8 is a solder ball or a metal bump formed on the front surface of the substrate 1. Accordingly, the second electrical connection structure 11 may also be a solder ball or a metal bump formed on the back surface of the substrate 1.

According to an embodiment of the present application, the system-on-chip integrated packaging structure also includes a second insulating layer 7 formed on the first insulating layer 5 and the first metal redistribution 6. In a manufacturing process, a position for manufacturing the first electrical connection structure 8 is reserved on the second insulating layer 7.

According to an embodiment of the present application, a passivation layer 10 is formed on the back surface 104 of the substrate 1 and a hole wall of the conductive via 9. In a manufacturing process, a position for manufacturing the second electrical connection structure 11 is reserved on the passivation layer 10.

According to an embodiment of the present application, a plurality of chips may be disposed in the recess 2, and two adjacent chips may be independent of each other or electrically connected to each other.

According to another embodiment of the present application, a plurality of recesses may be disposed on the substrate 1, and one chip is disposed in one recess. Two adjacent chips may be independent of each other or electrically connected to each other.

The system-on-chip integrated packaging structure according to the embodiment of the present application has the following advantages.

(1) The front surface of the substrate is provided with the first electrical connection structure, and the back surface of the substrate is provided with the second electrical connection structure. Different chips may be welded through the first electrical connection structure and the second electrical connection structure, which is conducive to form a three-dimensional stacked structure with high-density interconnection, miniaturized packaging and thinning.

(2) The side walls of the recess and the conductive via may be covered with the insulating layer. If the substrate is made of insulating materials, the side walls of the recess and the conductive via may no longer be covered with the insulating layer. Therefore, the substrate may adopt an insulating substrate or a non-insulating substrate, making a scheme of a manufacturing process flexible.

(3) The conductive via vertically connected on the front surface and the back surface of the substrate are open on the back surface.

(4) After the conductive via is rewired through Re-Distribution Layer (RDL), it is first full-filled with polymer, which may reduce a risk of residual photoresist in the conductive via in a post process of a lithography process (such as manufacturing pads through the lithography process), or the via structure may be covered by polymer but not filled, which may reduce a stress in the conductive via.

Figure 2:
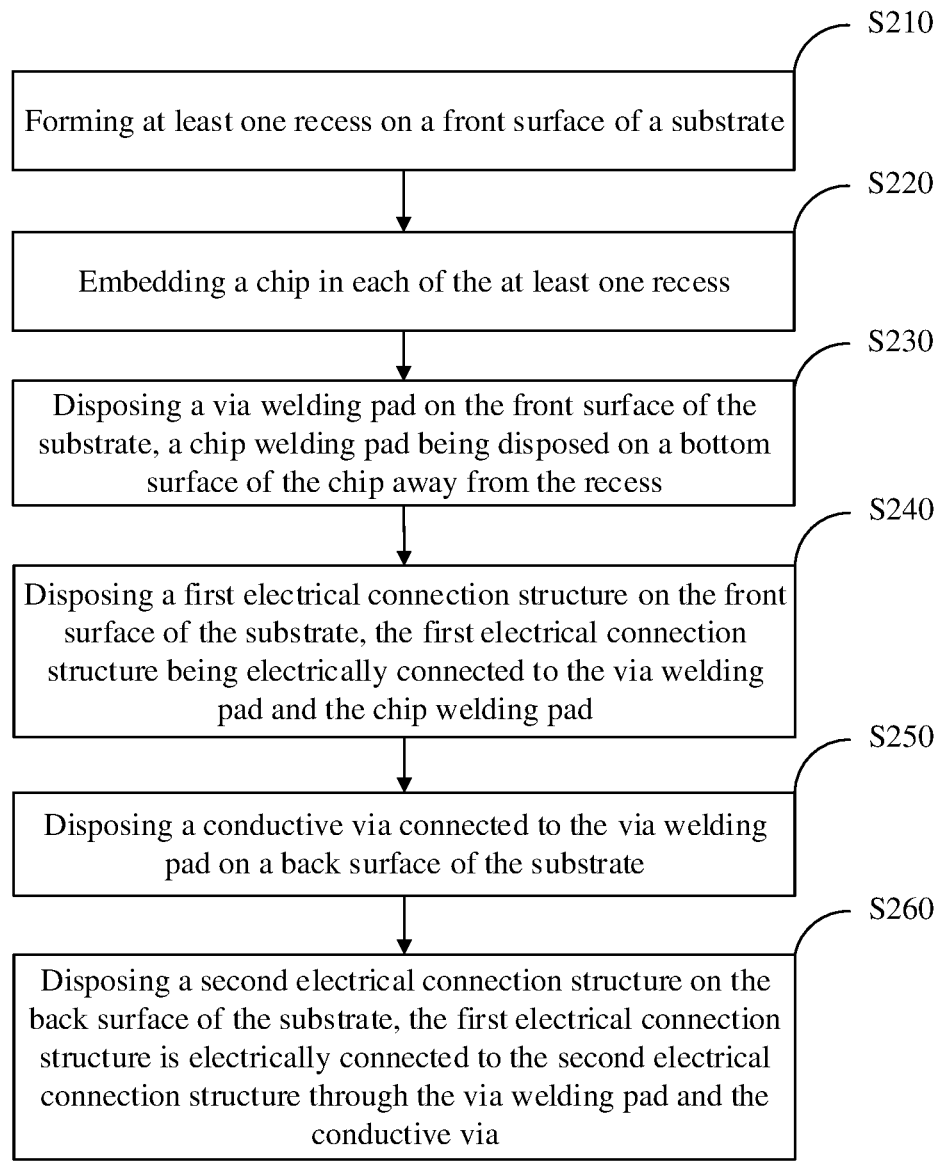
FIG. 2 is a schematic flowchart of a manufacturing method for a system-on-chip integrated packaging structure according to an embodiment of the present application.

Based on the system-on-chip integrated packaging structure introduced in the above embodiment, an embodiment of the present application also provides a manufacturing method of a system-on-chip integrated packaging structure. As shown in FIG. 2, the manufacturing method of a system-on-chip integrated packaging structure includes the following steps.

S210: forming at least one recess on a front surface of a substrate.

Specifically, at least one recess is formed on the front surface of the substrate by etching.

S220: embedding a chip in each of the at least one recess.

The chip may be fixed in the recess by adhesion, and a gap may be reserved between the chip and a side wall of the recess.

S230: disposing a via welding pad on the front surface of the substrate, a chip welding pad being disposed on a bottom surface of the chip away from the recess.

A first insulating layer may be laid on the front surface of the substrate, a welding pad surface of the chip and the gap between the chip and the recess. The first insulating layer may expose a position of the via welding pad and a position of the chip welding pad.

When the substrate is made of an insulating material, there is no need to deposit the insulating layer on the front surface of the substrate and the gap between the chip and the recess.

S240: disposing a first electrical connection structure on the front surface of the substrate, the first electrical connection structure being electrically connected to the via welding pad and the chip welding pad.

S250: disposing a conductive via connected to the via welding pad on a back surface of the substrate.

S260: disposing a second electrical connection structure on the back surface of the substrate, the first electrical connection structure is electrically connected to the second electrical connection structure through the via welding pad and the conductive via.

The embodiment of the present application provides the manufacturing method for a system-on-chip integrated packaging structure. By disposing the first electrical connection structure on the front surface of the substrate, disposing the conductive via electrically connected to the first electrical connection structure on the back surface of the substrate, and then disposing the second electrical connection structure on the back surface of the substrate, a manufacturing process may be simplified and manufacturing costs may be reduced, so that different chips may be electrically connected by means of the first electrical connection structure and the second electrical connection structure, which is conducive to form a three-dimensional stacked structure with high-density interconnection, miniaturized packaging and thinning.

According to an embodiment of the present application, the disposing a first electrical connection structure on the front surface of the substrate (step S240) includes: disposing a first metal redistribution on the via welding pad and a side of the chip welding pad away from the substrate; and disposing the first electrical connection structure on a side of the first metal redistribution away from the substrate.

Specifically, the via welding pad may be disposed at a via welding pad position, and the chip welding pad may be disposed at a chip welding pad position, and then the first metal redistribution may be manufactured on the first insulating layer. The first metal redistribution is electrically connected to the via welding pad and the chip welding pad. Alternatively, the first metal redistribution may be manufactured directly on the first insulating layer, and the first metal redistribution may fill the via welding pad position and the chip welding pad position.

Further, a second insulating layer is manufactured on the first insulating layer and the first metal redistribution, a position of the first electrical connection structure is reserved, and the first electrical connection structure is manufactured at the reserved position.

According to an embodiment of the present application, the disposing a conductive via connected to the via welding pad on the back surface of the substrate (step S250) includes: coating an adhesive layer on the front surface of the substrate, and bonding a bearing sheet on the adhesive layer through a temporary bonding process; thinning the substrate from the back surface of the substrate; and disposing a conductive via on the back surface of the thinned substrate.

Specifically, the conductive via may be connected to the first metal redistribution located at the position of the via welding pad.

According to an embodiment of the present application, the disposing a second electrical connection structure on the back surface of the substrate (step S260) includes: disposing a second metal redistribution on a side wall of the conductive via, the second metal redistribution extending to the back surface of the substrate and the second metal redistribution being electrically connected to the first electrical connection structure through the via welding pad; filling the conductive via provided with the second metal redistribution with polymer; and disposing the second electrical connection structure on a side of the second metal redistribution away from the substrate.

Specifically, a first passivation layer may be covered on the back surface of the substrate and the side wall of the conductive via, and the second metal redistribution may be manufactured on the first passivation layer, so that the second metal redistribution may be electrically connected to the first metal redistribution at the position of the via welding pad through the conductive via.

In a process of forming the second metal redistribution, the conductive via is at least partially filled with metal.

Further, a second passivation layer is manufactured on the first passivation layer, and a position of the second electrical connection structure is reserved for manufacturing the second electrical connection structure.

By debonding, the bearing sheet is removed and the adhesive layer is cleaned to complete a manufacturing process of the system-on-chip integrated packaging structure.

According to an embodiment of the present application, a plurality of chips may be disposed in the recess, and two adjacent chips may be independent of each other or electrically connected to each other.

According to another embodiment of the present application, a plurality of recesses may be disposed on the substrate, and one chip is disposed in one recess. Two adjacent chips may be independent of each other or electrically connected to each other.

Figure 3:
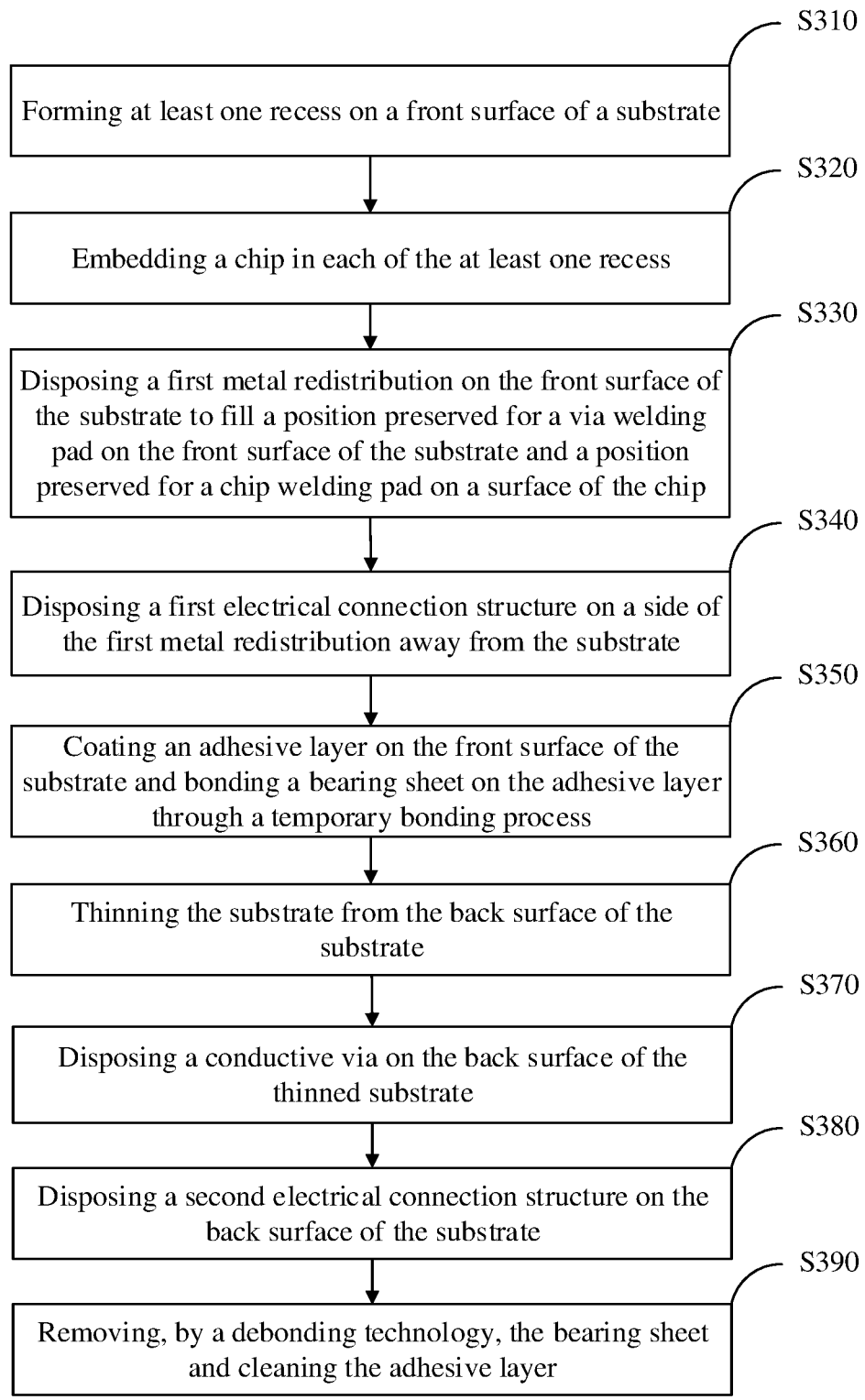
FIG. 3 is a schematic flowchart of a manufacturing method for a system-on-chip integrated packaging structure according to another embodiment of the present application.

FIG. 3 is a schematic flowchart of a manufacturing method for a system-on-chip integrated packaging structure according to another embodiment of the present application. As shown in FIG. 3, the manufacturing method of the system-on-chip integrated packaging structure includes the following steps.

S310: forming at least one recess on a front surface of a substrate.

Figure 4:
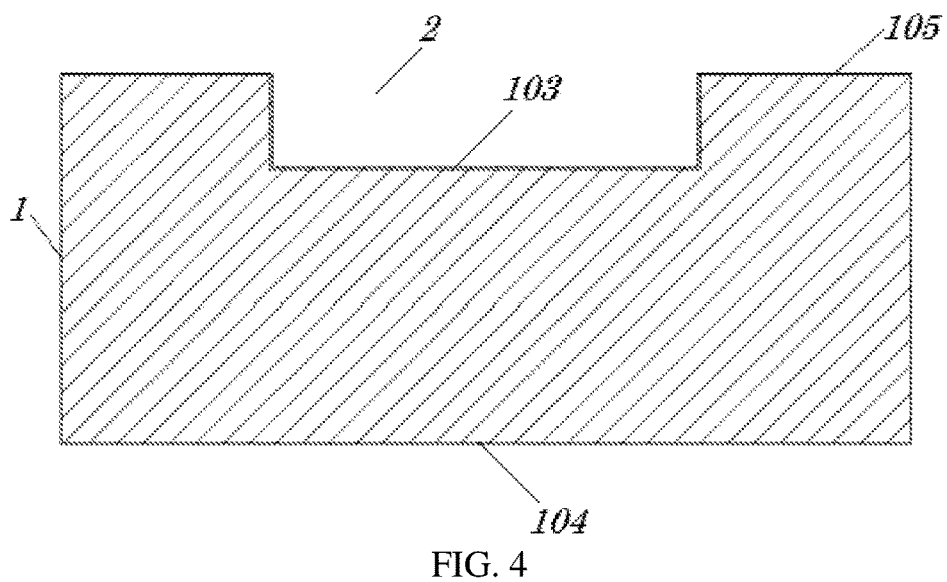
FIG. 4 to FIG. 15 are schematic structural diagrams of packaging structures corresponding to each step in the manufacturing method for the system-on-chip integrated packaging structure shown in FIG. 3.

As shown in FIG. 4, a substrate 1 is provided, which includes a front surface 103 and an opposite back surface 104. At least one recess 2 is etched on the front surface of the substrate 1. A vertical cross-section shape of the recess 2 may be trapezoidal or rectangular. A top view of the recess 2 may be rectangular, square or other shapes suitable for an arrangement of various chips and the embedding of various chips. A size of an opening at a top of the recess 2 is greater than or equal to a size of a bottom of the recess 2, a depth of the recess 2 is less than or equal to a thickness of the substrate 1, and a size of the recess 2 may meet a requirement of placing the chip in the recess 2. If the substrate 1 is made of silicon, a silicon oxide layer 105 needs to be deposited on the front surface as an insulating layer. If the substrate 1 is made of an insulating material, there is no need to deposit silicon oxide on the front surface.

S320: embedding a chip in each of the at least one recess.

Figure 5:
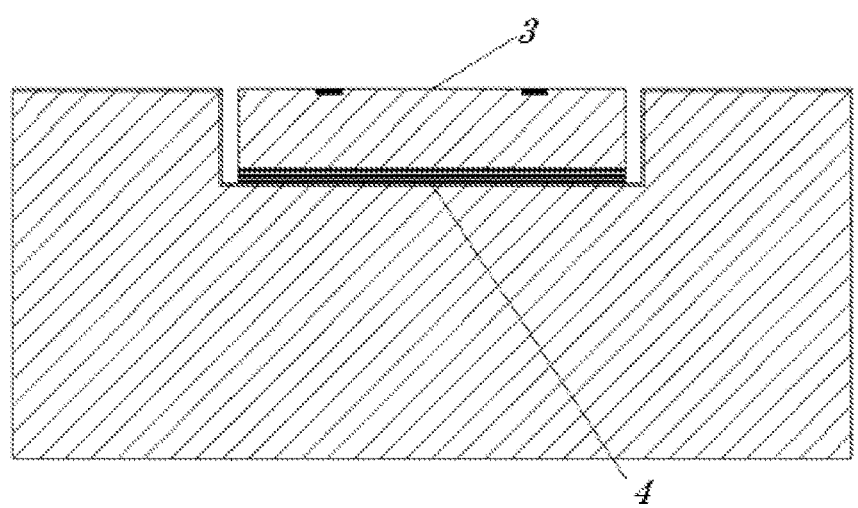

As shown in FIG. 5, at least one chip 3 is pasted in the recess 2 through an adhesive layer 4, and a welding pad surface of the chip 3 faces outward. The surface of the chip 3 with the welding pad is close to the front surface of the substrate 1, and there is a gap between the chip 3 and the side wall of the recess 2. In a specific implementation, the chip 3 may be pasted into the recess 2 of the substrate 1 through adhesive or dry film. A connection method adopted in this embodiment is to use the adhesive for bonding.

S330: disposing a first metal redistribution on the front surface of the substrate to fill a position preserved for a via welding pad on the front surface of the substrate and a position preserved for a chip welding pad on a surface of the chip.

Figure 6:
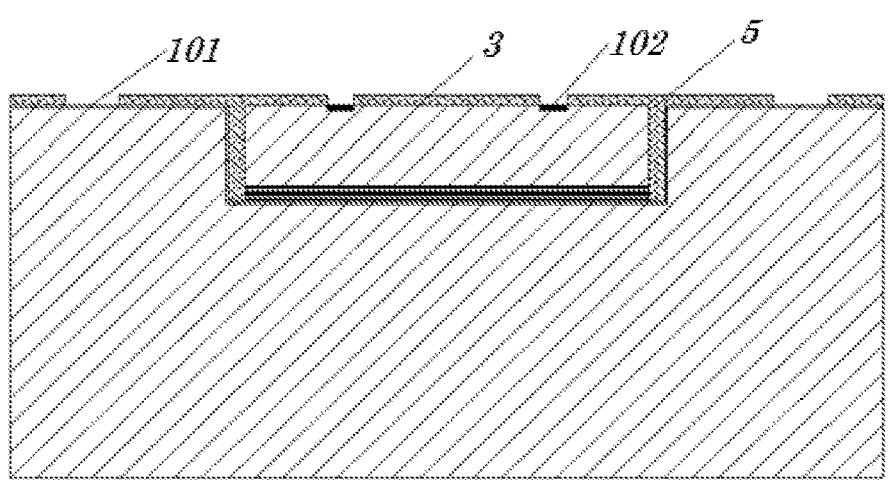

As shown in FIG. 6, a first insulating layer 5 is laid in the gap between the chip 3 and the side wall of the recess 2, on the welding pad surface of the chip 3 and on the front surface of the substrate 1, and then a conductive via welding pad position 101 is reserved and a chip welding pad position 102 is exposed by photolithography. In a specific implementation, the first insulating layer 5 may be formed by coating photoresist or pressing dry film. In this embodiment, the pressing dry film is used to fill the gap and form the first insulating layer 5 at the same time.

Figure 7:
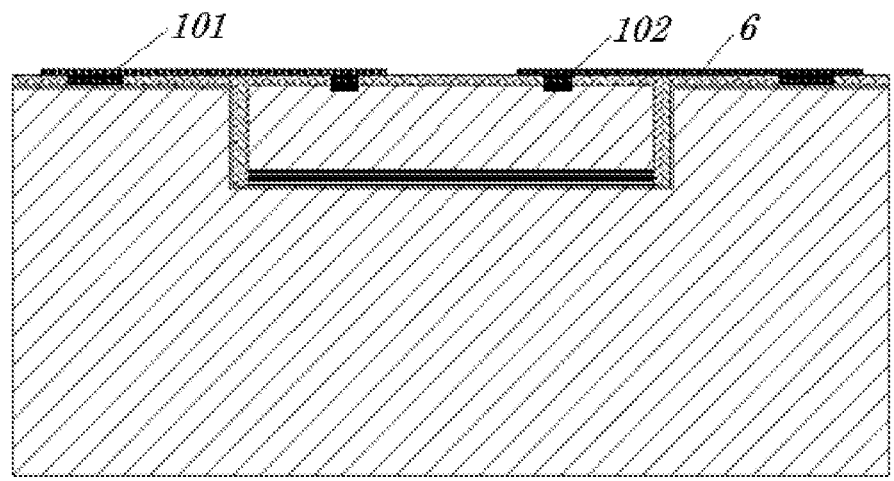

As shown in FIG. 7, a first metal redistribution 6 is manufactured on the first insulating layer 5, and the first metal redistribution 6 fill the reserved conductive via welding pad position 101 and the chip welding pad position 102.

S340: disposing a first electrical connection structure on a side of the first metal redistribution away from the substrate.

Figure 8:
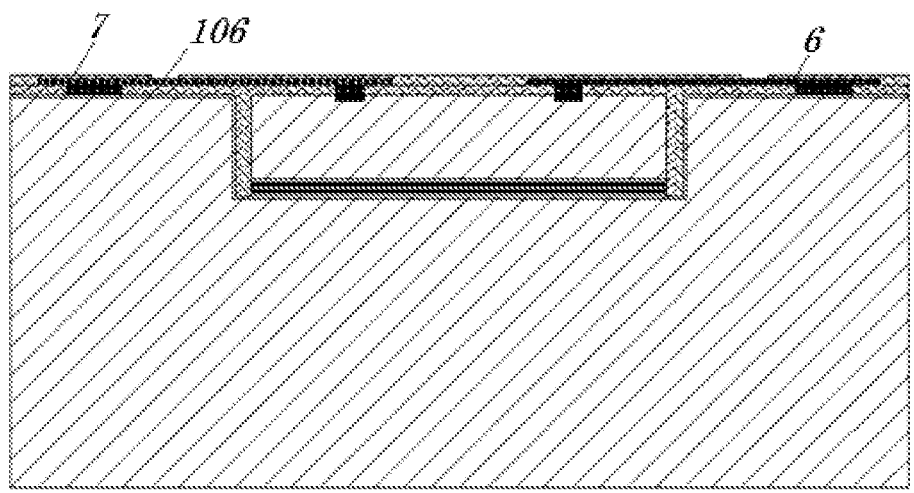

As shown in FIG. 8, a second insulating layer 7 is manufactured on the first metal redistribution 6, and a welding pad 106 is reserved by photolithography. A material of the second insulating layer 7 and a material of the first insulating layer may be the same or similar. Preferably, the second insulating layer is manufactured by spin coating.

Figure 9:
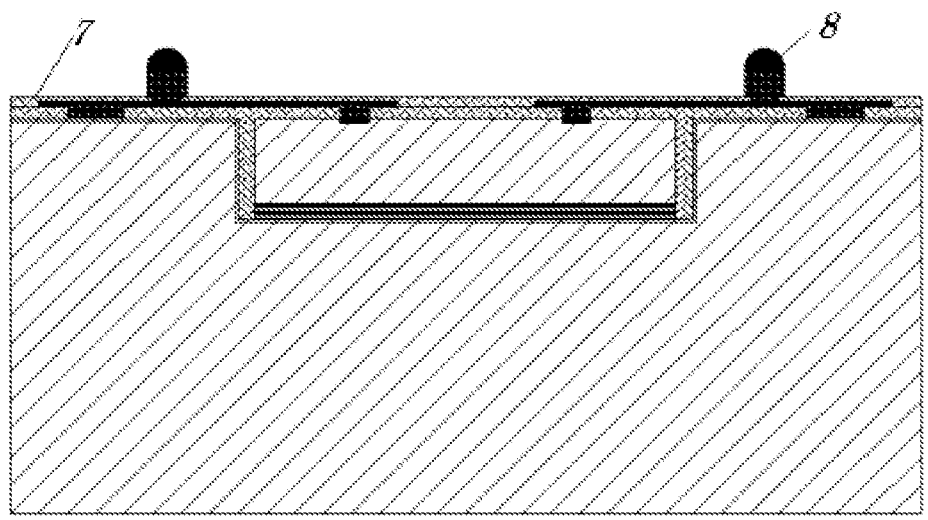

As shown in FIG. 9, an electrical derivation structure (the first electrical connection structure 8) is formed at a welding pad on the front surface of the substrate 1. The electrical derivation structure may be a solder ball or a metal bump, etc. In this embodiment, the metal bump is preferred, as shown in FIG. 9. A manufacturing method of the metal bump is an electroplating and reflow process. The metal material is any one or more of copper, nickel, palladium, gold, tin and silver. In this embodiment, copper, nickel, tin or silver is preferred.

S350: coating an adhesive layer on the front surface of the substrate and bonding a bearing sheet on the adhesive layer through a temporary bonding process.

Figure 10:
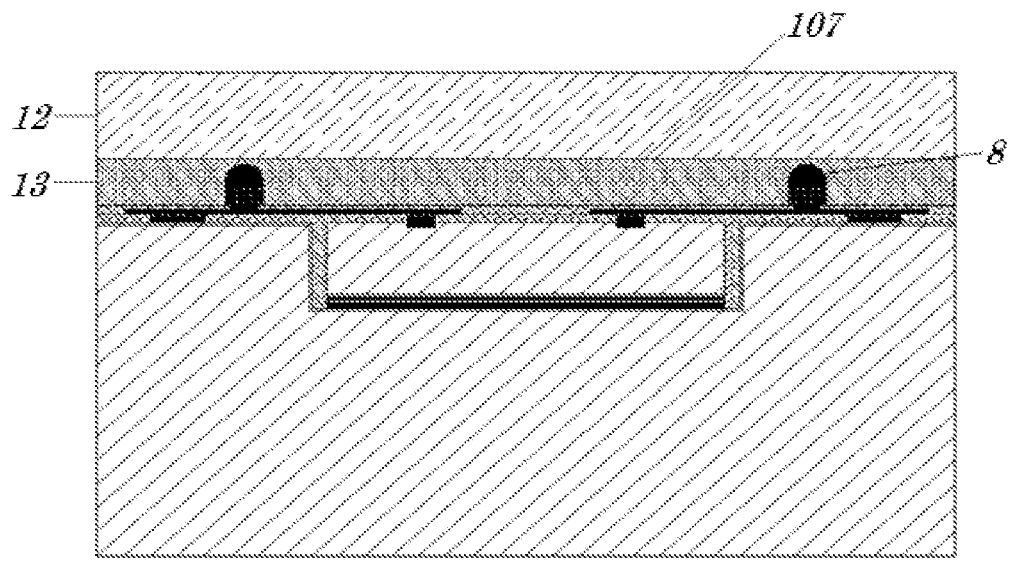

As shown in FIG. 10, the adhesive layer 13 is coated on the front surface of the substrate 1 to protect the metal bump, and the bearing sheet 12 is bonded on the adhesive layer 13 through the temporary bonding process to support the substrate 1 for back processing. The bearing sheet may be made of glass, silicon, metal or plastic. In this embodiment, glass is preferred to be used as the bearing sheet, and a layer of photosensitive material is coated on an inner surface of the glass by using a light transmission performance of the glass. Finally, the glass is removed by a laser debonding process.

S360: thinning the substrate from the back surface of the substrate.

Figure 11:
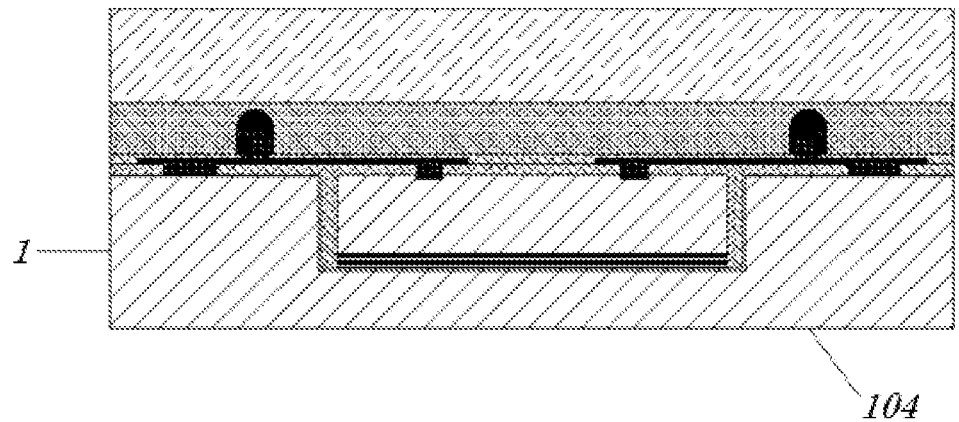

As shown in FIG. 11, the back surface of the substrate 1 is ground and thinned. A thinning process of the substrate 1 may be one or a combination of grinding, dry etching or wet etching. In this embodiment, the grinding and the dry etching are preferred. The grinding removes excess silicon and the dry etching removes a stress-strain layer caused by the grinding.

S370: disposing a conductive via on the back surface of the thinned substrate.

Figure 12:
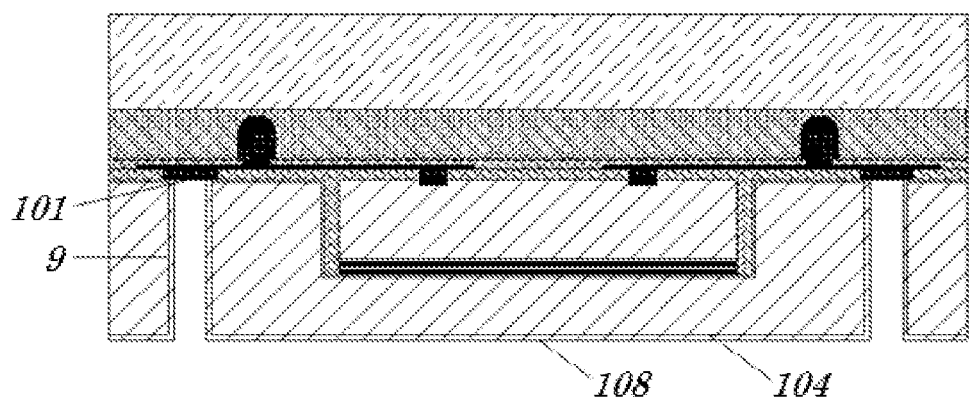

As shown in FIG. 12, at least one conductive via 9 is manufactured in an area outside the back surface of the recess 2 on the back surface of the substrate 1. The at least one conductive via may be a straight hole or an inclined hole. The straight hole is formed by dry etching, laser and other technologies for signal interconnection. In this embodiment, the straight hole is preferred. The side wall of the straight hole and the back surface of the substrate 1 cover a back first passivation layer 108, which may be made of silicon dioxide. The back first passivation layer 108 may be formed by a process of passivation adhesive spraying, dry film or chemical vapor deposition. The conductive via welding pad position 101 at the bottom of the hole may be exposed by photolithography development or chemical etching. In this embodiment, the chemical vapor deposition process is preferred. A silicon oxide layer is deposited to cover the back surface 104 of the silicon substrate and the vertical conductive via 9. The silicon oxide at the bottom of the vertical conductive via 9 is removed by an oxide layer etching process, exposing the conductive vias welding pad position 101.

S380: disposing a second electrical connection structure on the back surface of the substrate.

Figure 13:
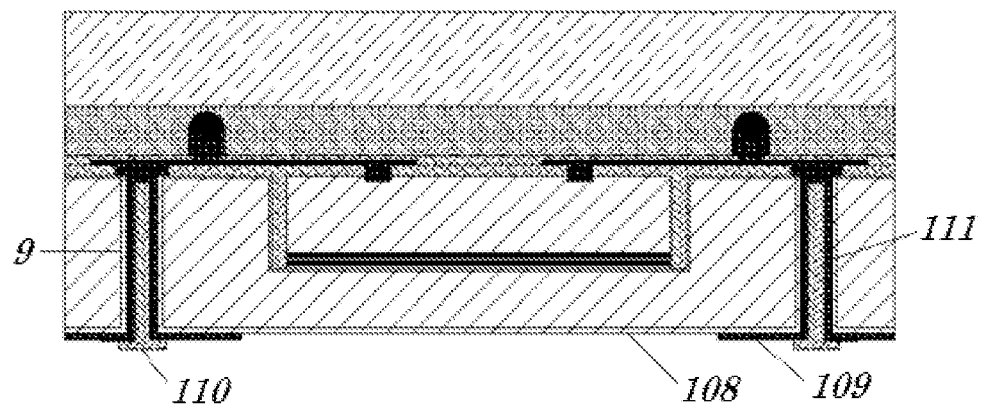

As shown in FIG. 13, the second metal redistribution 109 is manufactured on the surface of the conductive via 9 and the back first passivation layer 108, and the second metal redistribution 109 is electrically connected to the conductive via welding pad position 101. In a specific implementation, the metal material of each layer of metal redistribution may be one or two of copper, nickel, target and gold. A method of forming metal redistribution may be one or two of electroplating, electroless plating, vacuum evaporation and physical vapor deposition. The metal may be full filled or partially filled in the conductive via. In this embodiment, considering of costs, the conductive via is not full filled with metal. Because it is convenient to full fill the straight hole for manufacturing operation, a reserved gap of the conductive via that is not filled with metal may be filled by dry film or passivation adhesive or other polymers to form a hole plugging structure 110. The reserved gap may adopt a full-hole plugging structure, a half-hole plugging structure or a non plugging structure. In this embodiment, the full-hole plugging structure is preferred. Preferably, a material of the metal redistribution in the conductive via is titanium and/or copper.

Figure 14:
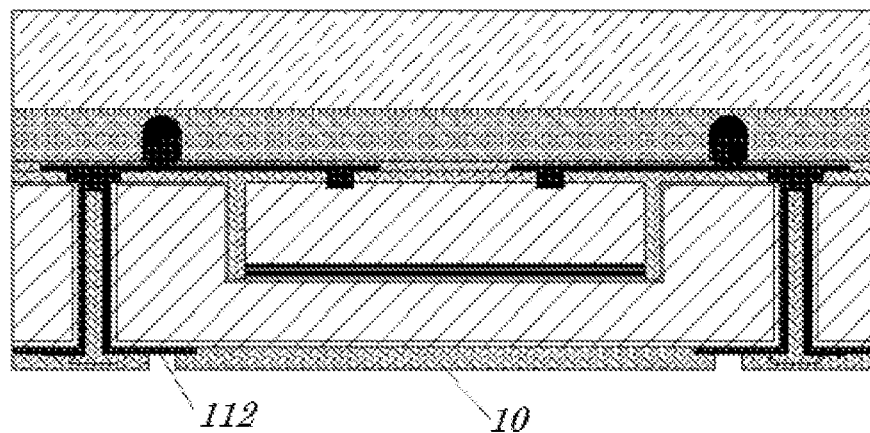

As shown in FIG. 14, a back second passivation layer 10 is manufactured on the second metal redistribution 109. A material of the back second passivation layer may be the same or similar to a material of the hole plugging structure 110, and a welding pad 112 is manufactured by a photolithography process.

Figure 15:
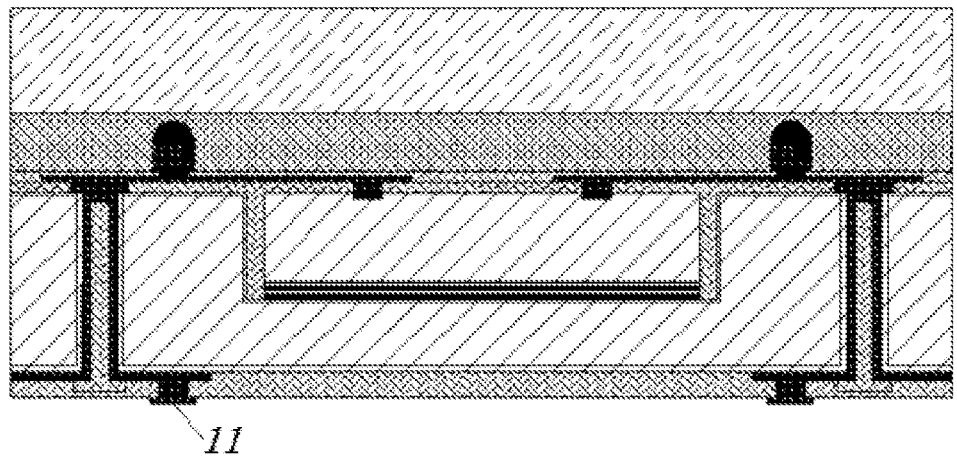

As shown in FIG. 15, an electrical derivation structure (the second electrical connection structure 11) is formed at the welding pad on the back surface of the substrate 1. The electrical derivation structure may be a solder ball or a metal bump, etc. In this embodiment, the metal bump is preferred. A manufacturing method of the metal bump is electroplating. The metal material may be any one or more of copper, nickel, palladium, gold, tin and silver. In this embodiment, copper, nickel or gold is preferred.

S390: removing, by a debonding technology, the bearing sheet and cleaning the adhesive layer.

As shown in FIG. 1, by the debonding technology, the bearing sheet 12 is removed and the adhesive layer 13 is cleaned. The debonding technology includes mechanical debonding, thermal debonding, laser debonding and ultraviolet debonding, etc. In this embodiment, the laser debonding is preferred.

An embodiment of the present application also provides a three-dimensional stacked device, including at least two system-on-chip integrated packaging structures disposed in layers as described above. Specifically, in an adjacent system-on-chip integrated packaging structure, a second electrical connection structure of a system-on-chip integrated packaging structure is electrically connected to a first electrical connection structure of another system-on-chip integrated packaging structure. In this way, a three-dimensional stacked structure with high-density interconnection, miniaturized packaging and thinning may be formed.

For those skilled in the art, it is obvious that the present application is not limited to the details of the above exemplary embodiments, and the present application may be realized in other specific forms without departing from the spirit or basic features of the present application. Therefore, no matter from which point of view, the embodiments should be regarded as exemplary and non limiting. The scope of protection of the present application is limited by the appended claims rather than the above description. Therefore, it is intended to include all changes within the meaning and scope of the equivalent elements of the claims in the present application. Any reference numerals in the claims shall not be regarded as limiting the claims involved.

In addition, it should be understood that although this specification is described in accordance with the embodiments, not every embodiment contains only an independent technical solution. This description of the specification is only for clarity. Those skilled in the art should take the specification as a whole, and the technical solutions in each embodiment can also be properly combined to form other embodiments that may be understood by those skilled in the art.

What is claimed is:

1. A system-on-chip integrated packaging structure, comprising:
a substrate, a chip, a first electrical connection structure and a second electrical connection structure, wherein:
a front surface of the substrate is provided with a recess and a via welding pad, and a back surface of the substrate is provided with a conductive via extending to the via welding pad;
the chip is embedded in the recess, and a chip welding pad is disposed on a surface of the chip away from a bottom surface of the recess; and
the first electrical connection structure is formed on the front surface of the substrate, the second electrical connection structure is formed on the back surface of the substrate, the first electrical connection structure is electrically connected to the chip welding pad, and the first electrical connection structure is electrically connected to the second electrical connection structure through the via welding pad and the conductive via; and
the first electrical connection structure is electrically connected to the via welding pad and the chip welding pad through a first metal redistribution, and the second electrical connection structure is electrically connected to the via welding pad through a second metal redistribution extending into the conductive via, the conductive via is partially filled by the second metal redistribution with an opening towards the back surface of the substrate, and an unfilled space of the conductive via is filled with polymer to form a hole plugging structure.

2. The system-on-chip integrated packaging structure according to claim 1, wherein a material of the substrate is an insulating material.

3. The system-on-chip integrated packaging structure according to claim 1, wherein a material of the substrate is a non-insulating material, and a first insulating layer is disposed between the front surface of the substrate, a side wall of the recess and the chip.

4. The system-on-chip integrated packaging structure according to claim 3, wherein the first insulating layer is made of silicon oxide, silicon nitride, polyimide or epoxy resin.

5. The system-on-chip integrated packaging structure according to claim 3, further comprising a second insulating layer formed on the first insulating layer and the first metal redistribution.

6. The system-on-chip integrated packaging structure according to claim 4, further comprising a second insulating layer formed on the first insulating layer and the first metal redistribution.

7. The system-on-chip integrated packaging structure according to claim 1, wherein a size of an opening at a top of the recess is greater than or equal to a size of a bottom of the recess, a depth of the recess is less than or equal to a thickness of the substrate, a shape of a cross-section of the recess is rectangular or trapezoidal, and the cross-section is on a plane perpendicular to and intersecting with the front surface and the back surface of the substrate.

8. The system-on-chip integrated packaging structure according to claim 1, wherein the first electrical connection structure is a first solder ball or a first metal bump formed on the front surface of the substrate, and the second electrical connection structure is a second solder ball or a second metal bump formed on the back surface of the substrate.

9. The system-on-chip integrated packaging structure according to claim 1, further comprising: a passivation layer formed on the back surface of the substrate and a hole wall of the conductive via.

10. A three-dimensional stacked device, wherein the three-dimensional stacked device comprises:

at least two system-on-chip integrated packaging structures according to claim 1 disposed in layers, wherein in an adjacent system-on-chip integrated packaging structure, a second electrical connection structure of a system-on-chip integrated packaging structure is electrically connected to a first electrical connection structure of another system-on-chip integrated packaging structure.

11. A manufacturing method for a system-on-chip integrated packaging structure, comprising:

forming at least one recess on a front surface of a substrate;

embedding a chip in each of the at least one recess;

disposing a via welding pad on the front surface of the substrate, wherein a chip welding pad is disposed on a surface of the chip away from a bottom surface of the recess;

disposing a first electrical connection structure on the front surface of the substrate, wherein the first electrical connection structure is electrically connected to the via welding pad and the chip welding pad;

disposing a conductive via connected to the via welding pad on a back surface of the substrate; and disposing a second electrical connection structure on the back surface of the substrate, wherein the first electrical connection structure is electrically connected to the second electrical connection structure through the via welding pad and the conductive via; wherein the disposing a first electrical connection structure on the front surface of the substrate comprises:

disposing a first metal redistribution on the via welding pad and a side of the chip welding pad away from the substrate; and disposing the first electrical connection structure on a side of the first metal redistribution away from the substrate, the disposing a second electrical connection structure on the back surface of the substrate comprises:

disposing a second metal redistribution on a side wall of the conductive via, wherein the second metal redistribution extends to the back surface of the substrate, and the second metal redistribution is electrically connected to the first electrical connection structure through the via welding pad;

filling the conductive via provided with the second metal redistribution with polymer; and disposing the second electrical connection structure on a side of the second metal redistribution away from the substrate;

wherein the conductive via is partially filled by the second metal redistribution with an opening towards the back surface of the substrate, and an unfilled space of the conductive via is filled with the polymer to form a hole plugging structure.

12. The manufacturing method for a system-on-chip integrated packaging structure according to claim 11, wherein the disposing a conductive via connected to the via welding pad on the back surface of the substrate comprises:

coating an adhesive layer on the front surface of the substrate, and bonding a bearing sheet on the adhesive layer through a temporary bonding process;

thinning the substrate from the back surface of the substrate;

disposing the conductive via on the back surface of the thinned substrate; and removing, by a debonding technology, the bearing sheet and cleaning the adhesive layer.

* * * * *